United States Patent
Lee

(10) Patent No.: US 11,613,810 B2
(45) Date of Patent: Mar. 28, 2023

(54) FILM DEPOSITION APPARATUS WITH GAS ENTRAINING OPENINGS

(71) Applicant: Nova Engineering Films, Inc., Los Altos Hills, CA (US)

(72) Inventor: Sang In Lee, Los Altos Hills, CA (US)

(73) Assignee: Nova Engineering Films, Inc., Los Altos Hills, CA (US)

( * ) Notice: Subject to any disclaimer, the term of this patent is extended or adjusted under 35 U.S.C. 154(b) by 87 days.

(21) Appl. No.: 17/373,363

(22) Filed: Jul. 12, 2021

(65) Prior Publication Data

US 2021/0363634 A1 Nov. 25, 2021

Related U.S. Application Data

(62) Division of application No. 16/361,103, filed on Mar. 21, 2019, now Pat. No. 11,091,834.

(Continued)

(51) Int. Cl.
*C23C 16/40* (2006.01)
*C23C 16/455* (2006.01)
*C23C 16/50* (2006.01)

(52) U.S. Cl.
CPC ............ *C23C 16/455* (2013.01); *C23C 16/50* (2013.01)

(58) Field of Classification Search
CPC ... C23C 16/455; C23C 16/4412; C23C 16/18; C23C 16/4481; C23C 16/50; C23C 16/45574; C23C 16/45576; C23C 16/4551; C23C 4/134; C23C 4/01; C23C 16/045; B05D 1/60; H01L 45/1616; B05B 7/22

(Continued)

(56) References Cited

U.S. PATENT DOCUMENTS 4,902,359 A 2/1990 Takeuchi et al.
5,453,124 A * 9/1995 Moslehi ............ C23C 16/45561
118/725

(Continued)

FOREIGN PATENT DOCUMENTS

KR 10-2012-0065242 A 6/2012

OTHER PUBLICATIONS

PCT International Search Report and Written Opinion, PCT Application No. PCT/US2019/023478, dated Jul. 4, 2019, 13 pages.

(Continued)

*Primary Examiner* — Rudy Zervigon
(74) *Attorney, Agent, or Firm* — Fenwick & West LLP

(57) ABSTRACT

A film deposition apparatus includes a body formed with openings and cavity, a spray assembly, and a gas assembly. The spray assembly sprays a precursor stream into the cavity for forming a film on a substrate. The gas assembly injects one or more gases into the cavity through the openings to shape the precursor stream and improve directionality and utilization of the precursor stream. The film deposition apparatus can operate with one or more plasma generators to form a laminated film on the substrate. The laminated film may have three layers of film: a first film formed through reaction of a first precursor with plasma, a second film being a composite of the first precursor and a second precursor, and a third film formed through sonification of the second precursor on top of the second film. The second precursor can infiltrate into the first film and fill defects therein.

19 Claims, 10 Drawing Sheets

Related U.S. Application Data

(60) Provisional application No. 62/742,842, filed on Oct. 8, 2018, provisional application No. 62/647,435, filed on Mar. 23, 2018.

(58) Field of Classification Search
USPC ... 427/248.1, 569, 570, 533, 535, 96.8, 237, 427/255.23, 255.28
See application file for complete search history.

(56) References Cited

U.S. PATENT DOCUMENTS

| | | | |
|---|---|---|---|
| 5,562,841 | A | 10/1996 | Kulik et al. |
| 6,135,194 | A | 10/2000 | Flinn et al. |
| 8,156,996 | B2 | 4/2012 | Forbes et al. |
| 11,091,834 | B2 * | 8/2021 | Lee .................. C23C 16/45574 |
| 2011/0212625 | A1 * | 9/2011 | Toyoda ............... C23C 16/4585 438/758 |

OTHER PUBLICATIONS

United States Office Action, U.S. Appl. No. 16/361,103, dated Dec. 17, 2020, ten pages.

United States Office Action, U.S. Appl. No. 16/361,103, dated Aug. 28, 2020, eight pages.

\* cited by examiner

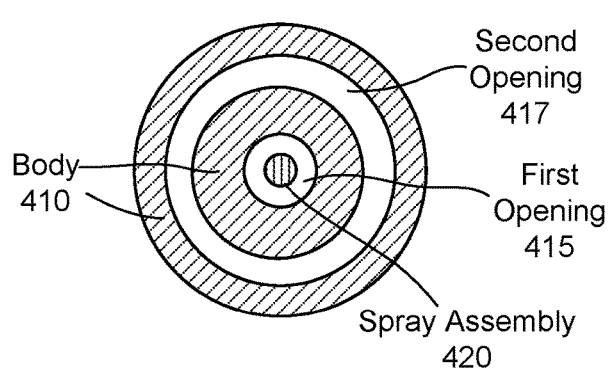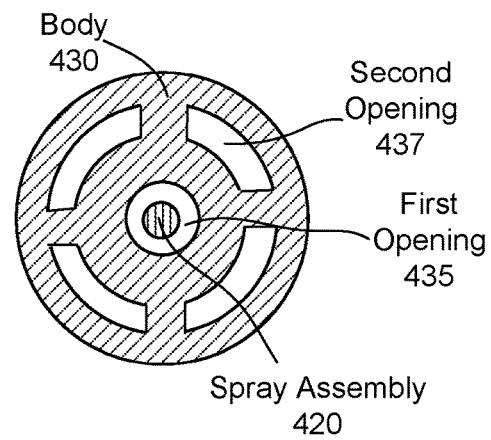
FIG. 4A  FIG. 4B
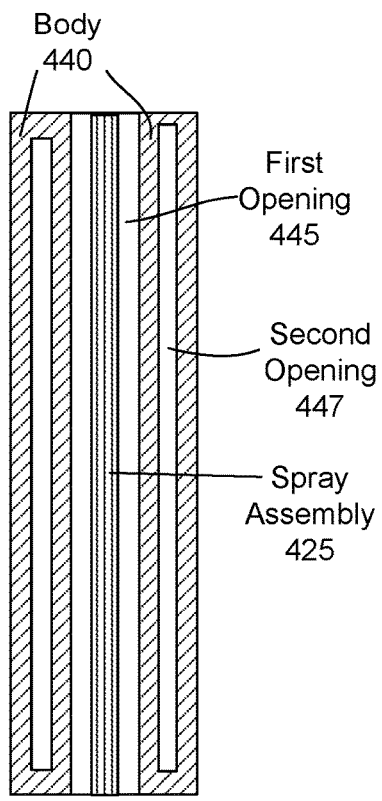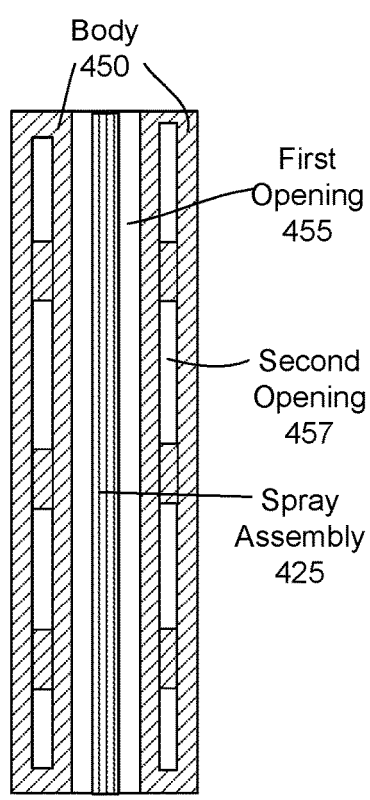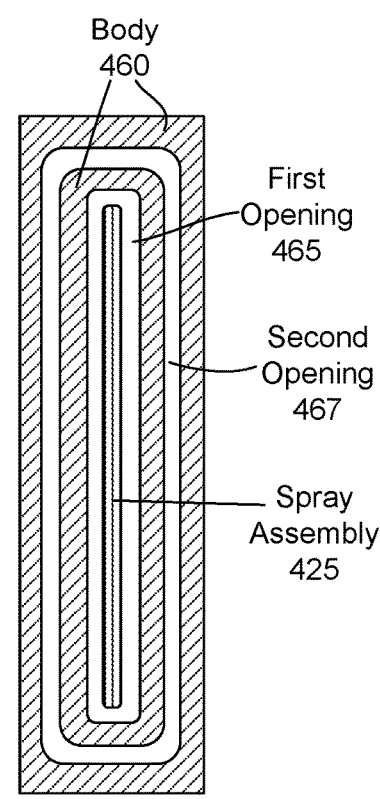
FIG. 4C  FIG. 4D  FIG. 4E

FILM DEPOSITION APPARATUS WITH GAS ENTRAINING OPENINGS

CROSS-REFERENCE TO RELATED APPLICATION

This application is a division of U.S. patent application Ser. No. 16/361,103, filed on Mar. 21, 2019 and claims the benefit of U.S. Provisional Patent Application No. 62/647,435, filed on Mar. 23, 2018 and U.S. Provisional Patent Application No. 62/742,842, filed on Oct. 8, 2018, which are incorporated by reference herein in their entirety.

BACKGROUND

Field of the Disclosure

The present disclosure generally relates to film formation, and specifically to a film deposition apparatus that is formed with openings for injecting gas to shape precursor streams.

Description of the Related Arts

A thin film can be a layer of material having a thickness from a nanometer to several micrometers. It can be deposited onto a substrate to change or improve properties of the substrate. Thin film deposition has enabled a wide range of technological breakthroughs in various areas, such as optical coating, semiconductor processing, food storage, energy generation, pharmaceuticals and so on. However, currently available film deposition devices fail to produce thin films with desirable properties. For example, thin films produced by these devices usually have voids. Also, these devices fail to form thin films with uniform thickness.

SUMMARY

Embodiments relate to a film deposition apparatus for depositing a film onto a substrate. The apparatus includes a body, a spray assembly that is mounted onto a body, and a gas assembly. The body includes an internal wall that defines a cavity, into which the spray assembly sprays a stream of precursor. The body is formed with openings extending towards the substrate. The gas assembly injects a gas, such as nitrogen or an inert gas, into the cavity of the body through the openings. Also, ambient gas can enter into the cavity through the openings. The injected gas and the ambient gas form an entraining gas that shapes the stream of precursor to reduce an amount of the precursor coming into contact with the internal wall. In some embodiments, the entraining gas can prevent the precursor stream from coming into contact with the internal wall.

In some embodiments, the openings include one or more first openings and one or more second openings. The second openings are located further from the spray assembly than the first openings. Different types of gas can be introduced into the cavity through the first and second openings. The body may also be formed with gas channels that are located further from the spray assembly than the second openings for injecting a curtain gas into the cavity for furthering shaping the stream of precursor. The entraining gas and curtain gas improve directionality and utilization of the precursor.

In some embodiments, the film deposition apparatus is part of a plasma reactor to form a laminated film on the substrate. The plasma reactor also includes two plasma generators. The film deposition apparatus sprays a first precursor towards the substrate. A portion of the precursor migrates to a space between one of the plasma generator and the substrate. The portion of the precursor reacts with plasma in the space and then is deposited onto the substrate and forms a first film. After the first film is formed, the substrate is moved in relative to the plasma reactor. The film deposition apparatus then sprays a second precursor to form a second film on top of the first film. The second film is a composite of the first precursor and the second precursor. Molecules of the second precursor can infiltrate into defects of the first film to fill the defects. A third film is also form through solidification of the second precursor on top of the second film. In some embodiments, the solidification of the second precursor is through reaction of the second precursor with the top surface of the second film or plasma on the top surface of the second film.

BRIEF DESCRIPTION OF THE DRAWINGS

The teachings of the embodiments can be readily understood by considering the following detailed description in conjunction with the accompanying drawings.

FIGS. 4A through 4E each illustrate a film deposition apparatus having a body formed with openings of different shapes, in accordance with an embodiment.

The figures depict various embodiments for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number corresponds to the figure in which the reference number is first used.

Embodiments relate to a film deposition apparatus formed with gas entraining openings. A spray assembly of the apparatus sprays or injects a precursor towards a substrate to form a precursor stream in a cavity of the apparatus. A gas assembly of the apparatus injects a gas into the cavity of the apparatus through the gas entraining openings when the precursor is sprayed or injected toward the substrate. The gas assembly can also control the flow rate of the gas. The gas can act as a curtain gas or virtual wall. The gas can also shape the precursor stream and prevent the precursor stream from contacting with an internal wall of the apparatus. With the gas entraining openings, the apparatus can produce a film having a uniform thickness distribution. The apparatus can also operate with plasma generators to form a defect-free laminated film.

Figure 1:
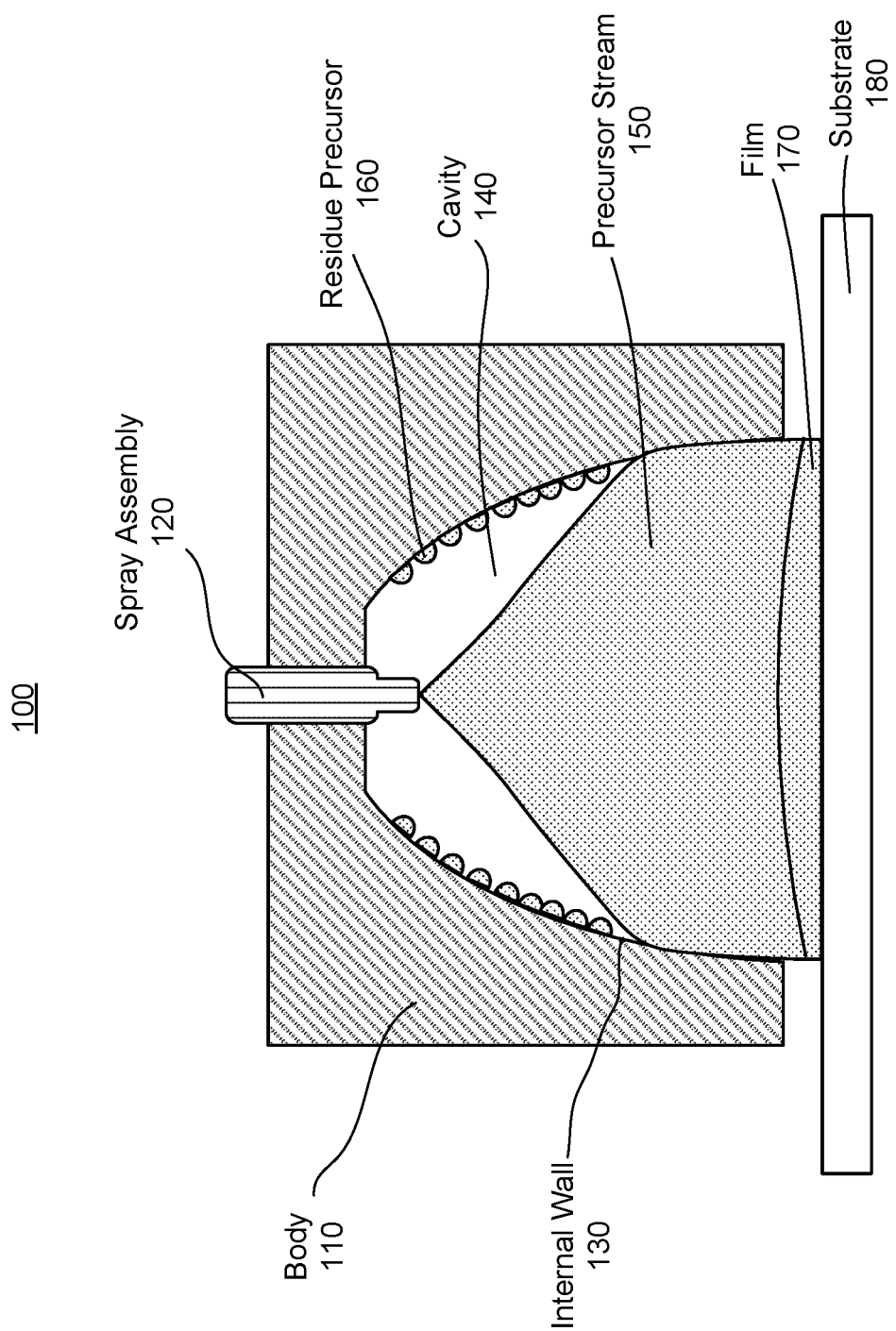
FIG. 1 is a schematic cross-sectional view of a film deposition apparatus, in accordance with an embodiment.

FIG. 1 is a schematic cross-sectional view of a film deposition apparatus 100, in accordance with an embodiment. The film deposition apparatus 100 deposits a film 170 onto a substrate 180 located below the film deposition apparatus 100. The film deposition apparatus 100 includes a body 110 and a spray assembly 120 that is mounted onto the body 110.

The body 110 is formed with an internal wall 130 that defines a cavity 140. The spray assembly 120 sprays a stream of precursor 150 into the cavity 140. As shown in FIG. 1, the precursor stream 150 has a conical shape. The spray assembly 120 may simultaneously or consecutively spray more than one type of precursors. A precursor can be organic or non-organic particles in either a gas state or a liquid state. In some embodiments, the spray assembly 120 is associated with a controller (not shown in FIG. 1) that provides instructions for spraying the precursor and forming the precursor stream 150. The instructions can specify composition of the precursor, spraying speed, spraying duration, position and/or orientation of the spray assembly 120, or any combination thereof.

Not all the sprayed precursor 150 arrives at the substrate 180. In embodiments where the precursor is sprayed or injected into a closed cavity, the flowing of the precursor stream draws gas along the precursor stream, causing a decrease in the pressure around the bottom of the spray assembly. A portion of the sprayed precursor ("residue precursor 160") is splattered from the precursor stream 150 and drifted to the lower pressured space or region The residue precursor 160 contacts the internal wall 130 of the body 110, solidifies on the internal wall 130, and forms clogs and/or coatings on the internal wall 130. The clogs and/or coatings can interfere with the operation of the film deposition apparatus 100. Therefore, frequent cleaning of the internal wall 130 is performed to remove the clogs and/or coatings.

Another portion of the precursor arrives at the substrate 180. The film 170 is formed by solidification of the precursor on the substrate 180. As shown in FIG. 1, the film 170 has a non-uniform thickness distribution. That is caused, at least in part, by an uneven density distribution of the precursor stream 150. A central region of the precursor stream 150 that is located below the spray assembly has a higher density than peripheral regions of the precursor stream 150. Due to the uneven density distribution of the precursor stream 150, different locations on the substrate 18 receive different amounts of the precursor 150, causing non-uniform thickness of the film 160. As shown in FIG. 1, a central part of the film 170 that is right below the spray assembly 120 is thicker than peripheral parts of the film 170 that are more distant from the spray assembly 120. The peripheral parts of the film 170 may also include more defects than the central part of the film 170. Remaining precursor that is not solidified but remains in the gas or liquid state can be discharged through gaps between the film deposition apparatus 100 and the substrate 180.

Figure 2:
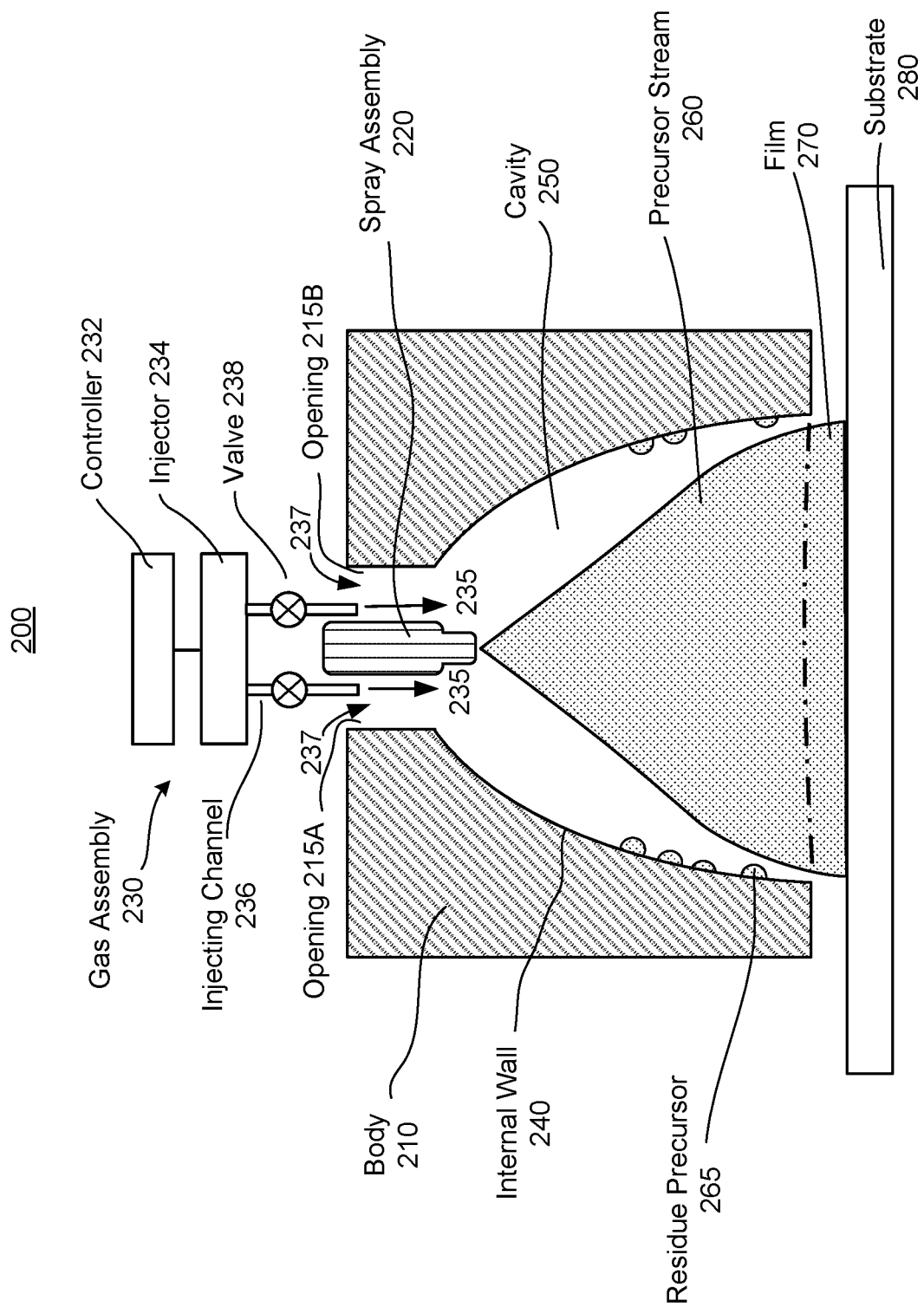
FIG. 2 is a schematic cross-sectional view of a film deposition apparatus including a body formed with openings, in accordance with an embodiment.

FIG. 2 is a schematic cross-sectional view of a film deposition apparatus 200 including a body 210 formed with openings 215, in accordance with an embodiment. The film deposition apparatus 200 also includes a spray assembly 220 and a gas assembly 230.

The body 210 has an internal wall 240 that defines a cavity 250. In the embodiment of FIG. 2, the body 210 is formed with two openings 215A and 215B (also collectively referred hereinafter as "openings 215" or individually "opening 215"). In other embodiments, the body 210 can be formed with a different number of openings. For example, the two openings 215A and 215B can be connected to become one single opening. Alternatively, the body 210 can be formed with more than two openings.

The spray assembly 220 sprays a stream of precursor 260 into the cavity 250 for forming a film 270 on a substrate 280. The spray assembly 220 can be mounted onto the body 210. An embodiment of the spray assembly 220 is the spray assembly 120 described in conjunction with FIG. 1.

The gas assembly 230 injects a gas 235 into the cavity 250 through the openings 215. The gas can be nitrogen or an inert gas. The gas assembly 230 may include, among other components, a controller 232, an injector 234, injecting channels 236, and valves 238. The controller 232 provides instructions to the injector 234. The instructions can specify amount of the gas 235, type of the gas 235, duration of the injection, speed of the injection, open or close of the valves 238, and so on. The injector 234 injects the gas 235 into the injecting channels 236 connected to the injector 234 in accordance with the instructions from the controller 232. Each of the injecting channels 236 may extend into the cavity 250 through an opening 215. A valve 238 is provided in each of the injecting channels 236. When a valve 238 is open, the gas 235 can be injected into the cavity 250 through the openings 215A and 216B. Also, ambient gas (such as air, nitrogen, or inert gas) 237 can enter into the cavity 250 through the openings 215A and 216B. The ambient gas 237 can be an oxidative gas or inert gas, such as air, Na, Ar, $N_2O$, $H_2O$, $O_2$, or $O_3$ for forming oxide films or oxygen atom-contained polymer films. In some embodiments, moisture and oxygen are removed from the ambient gas 237 for using a non-oxidative plasma process to form nitride films, metal films, carbon compound films without oxygen atom, and/or or polymer films. The ambient gas 237 can mix with the gas 235 to form an entraining gas for shaping the precursor stream 260. When the valve 238 is closed, the gas 235 cannot be injected into the cavity 250 but the ambient gas 235 can still be introduced from the surrounding ambient into the cavity 250. The amount of the entraining gas introduced into the cavity 250 when the valve 238 is closed is less than that when the valve 238 is open. The gas assembly 230 may have different configurations. For example, the injector 234 can be connected to one injecting channel, which is associated with all the openings 215 formed in the body 210. The controller 232 may also control the spray assembly 220 to adjust the amount and the timing of precursor gas injection into the cavity 250.

Because the openings 215 extend towards the substrate 280, the entraining gas flows towards the substrate 280. With such a flowing direction, the entraining gas can shape the precursor stream 260. As shown in FIG. 2, the precursor stream 260 has a bell shape, which is different from the conical shape of the precursor stream 150 in FIG. 1. Also, compared with the precursor stream 150 in FIG. 1, the precursor stream 260 is separated from the internal wall 240 within the cavity 250. Hence, the amount of residue precursor 265 that comes in to contact with the internal wall 240 is reduced compared to the amount of the residue precursor 160 in FIG. 1. Therefore, less frequent cleaning may be performed for the film deposition apparatus 200 compared to the film deposition apparatus 100.

Also, compared with the film 170, the film 270 has a more uniform thickness distribution. The thickness of a central part of the film 270 is similar to that of the peripheral parts of the film 270. The peripheral parts of the film 270 may have less defects than the peripheral parts of the film 170.

Figure 3:
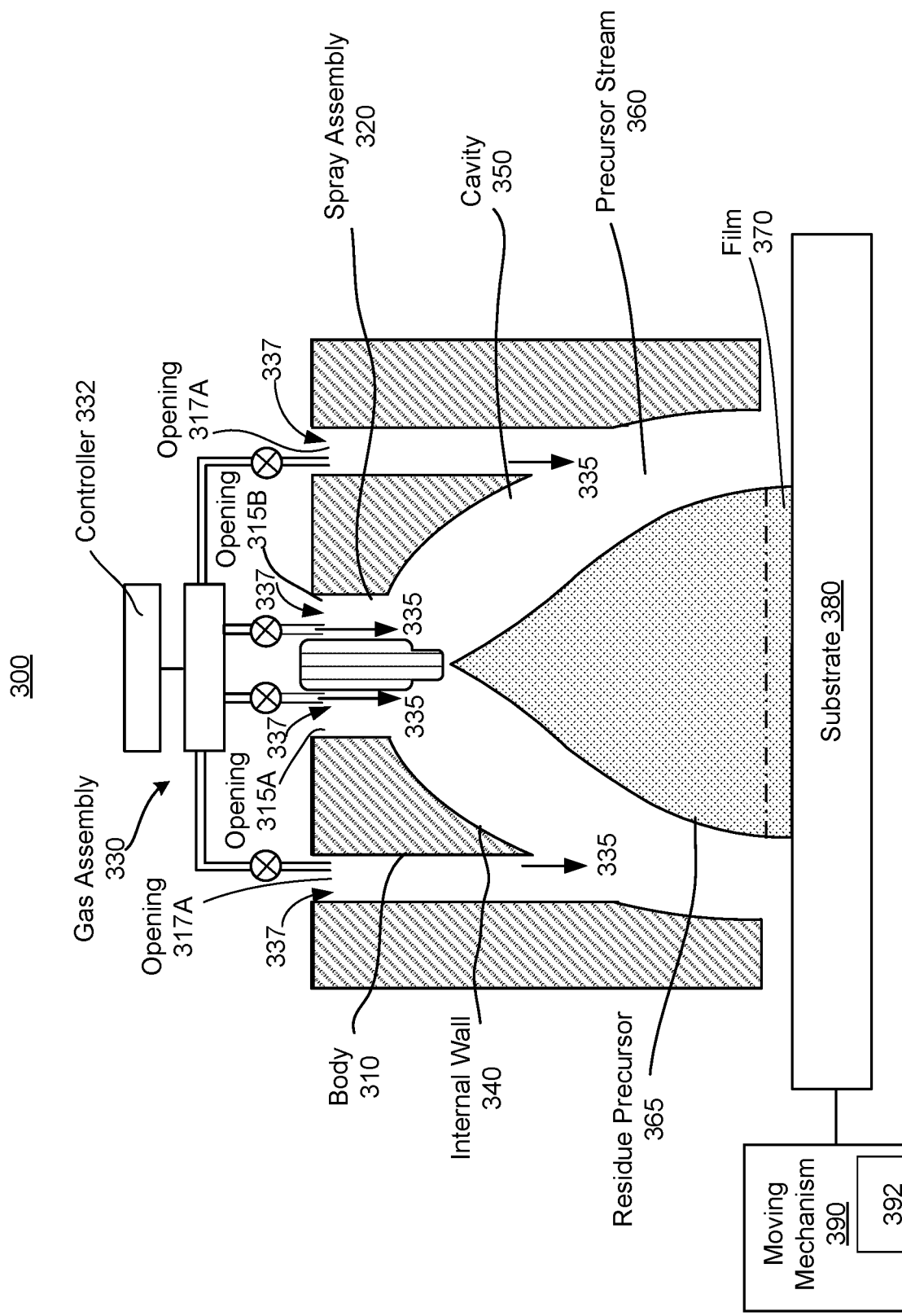
FIG. 3 is a schematic cross-sectional view of a film deposition apparatus including a body formed with two groups of openings, in accordance with an embodiment.

FIG. 3 is a schematic cross-sectional view of a film deposition apparatus 300 including a body 310 formed with two groups of openings 315 and 317, in accordance with an embodiment. The film deposition apparatus 300 deposits a film 370 onto a substrate 380. In addition to the body 310, the film deposition apparatus 300 also includes a spray assembly 320, a gas assembly 330, and a motor 390 attached to the substrate.

The body 310 has an internal wall 340. The internal wall 340 defines a cavity 350. The body 310 includes two first openings 315A and 315B (hereinafter collectively referred to as "first openings 315" and individually as "first opening 315"). and two second openings 317A and 317B (hereinafter collectively referred to as "second openings 317" and individually as "second opening 317"). The openings 315 and 317 extend towards the substrate 380. The two first openings 315 are closer to the spray assembly 320 than the two second openings 317. In other embodiments, the body 310 can be formed with a different number of openings. For example, the body 310 can be formed with one first opening and one second opening. Alternatively, the body 310 can be formed with more than four openings. The first openings 315 are closer to the spray assembly 320 than the second openings 317.

The spray assembly 320 sprays a stream of precursor 360 into the cavity 350. The spray assembly 320 can be mounted onto the body 310, for example, between the first openings 315. An embodiment of the spray assembly 320 is the spray assembly 120 described in conjunction with FIG. 1.

The gas assembly 330 injects a gas 335 into the cavity 250 through the openings 315 and 317. The gas 335 forms an entraining gas together with ambient gas 337 that enters into the cavity through the openings 315 and 317. In some embodiments, the gas assembly 330 injects different gases with different flow rates into the first opening 315 and second opening 317. An embodiment of the gas assembly 330 is the gas assembly 230 in FIG. 2.

The entraining gas flows in the cavity 250 and shapes the precursor stream 360. Compared with the precursor stream 260 in FIG. 2, the precursor stream 360 is even narrower and separated further away from the internal wall 240. This is advantageous, among other reasons, because (i) there is no residue precursor contacting with the internal wall 340 and there is no clog or coatings formed on the internal wall 340, which enable reduction in the frequency of cleaning the internal wall 340 to remove clogs or coatings, (ii) the downstream flowing speed of the precursor stream 360 is enhanced by the entraining gas, (iii) directionality and utilization of the precursor stream 360 is enhanced by narrowing down the precursor stream 360, and (iv) the resulting film 370 has a relatively uniform thickness distribution, as illustrated in FIG. 3. The thickness of a central part of the film 370 is the same as that of the peripheral parts of the film 370. The peripheral parts of the film 370 may have even less defects than the peripheral parts of the film 270. Compared with the film 270, performances of the film 370 are improved.

A moving mechanism 390 includes a motor 392 and linking parts (e.g., rack and pinion) to cause relative motion between the substrate 380 and the body 310. In some embodiments, the moving mechanism 390 is controlled by a controller 332 that provides the motor 390 instructions regarding motion of the substrate 380. The controller 332 can also communicate with the spray assembly 320 and the gas assembly 330 to facilitate film deposition during or after the motion of the substrate 380. In some embodiments, the substrate 380 moves in a way so that a designated section of the substrate 380 is deposited with the film 370. The substrate 380 may also move in a reciprocating manner so that multiple layers of materials are deposited on the substrate 380. In the embodiment of FIG. 3, the moving mechanism 390 is attached to the substrate 380. In other embodiments, the moving mechanism 390 can be attached to the body 310 to drive the body 310 to move while the substrate 380 remains still. Alternatively, the body 310 and the substrate 380 can both be associated with a moving mechanism so that they both can move.

The body 310 can be formed with openings of different shapes. FIGS. 4A through 4E each illustrate a film deposition apparatus having a body formed with openings of different shapes, in accordance with an embodiment. An embodiment of the film deposition apparatus can be the film deposition apparatus 300 in FIG. 3.

FIG. 4A is a cross-sectional view of a film deposition apparatus including a body 410 having a circular cross-section, in accordance with an embodiment. In FIG. 4A, the body 410 is formed with two openings: a first opening 415 and a second 417. Each of the openings 415 and 417 has a ring-shaped cross-section. The opening 415 encloses a spray assembly 420 and is closer to the spray assembly 420 than the other opening 417. FIG. 4B is a cross-sectional view of another film deposition apparatus including a body 430 having a circular cross-section, in accordance with an embodiment. The film deposition apparatus in FIG. 4B has the same spray assembly 420 as in FIG. 4A. In FIG. 4B, the body 430 is formed with a first opening 435 and a group of second openings 437. The first opening 435 is similar to the first opening 415 in FIG. 4A. However, the second openings 437 in FIG. 4B are discontinuous openings, as opposed to one single opening as the second opening 417 in FIG. 4A. The cross-section of each of the second openings 437 is a part of a ring. In other embodiments, the cross-section of the second openings 437 can have other shapes, such as circular, rectangular, etc. Also, the body 430 may have a different number of second openings 437.

FIGS. 4C and 4E are each a cross-sectional view of a film deposition apparatus including a body having a rectangular cross-section, in accordance with an embodiment. Each film deposition apparatus has a same spray assembly 425. In FIG. 4C, a body 440 is formed with two first openings 445 and two second openings 447, all of which have rectangular cross-sections. The first openings 445 are located on two sides of the spray assembly 425. The second openings 447 are further from the spray assembly 420 than the first opening 445. In FIG. 4D, the body 450 is formed with two first openings 455 and eight second openings 457. The first openings 455 are similar to the first openings 445 in FIG. 4C. However, the second openings 457 are discontinuous openings on each of the two sides of the spray assembly 425. In FIG. 4E, the body 460 is formed with one first opening 465 and one second opening 467. They each have a rack track shaped cross-section.

Figure 5:
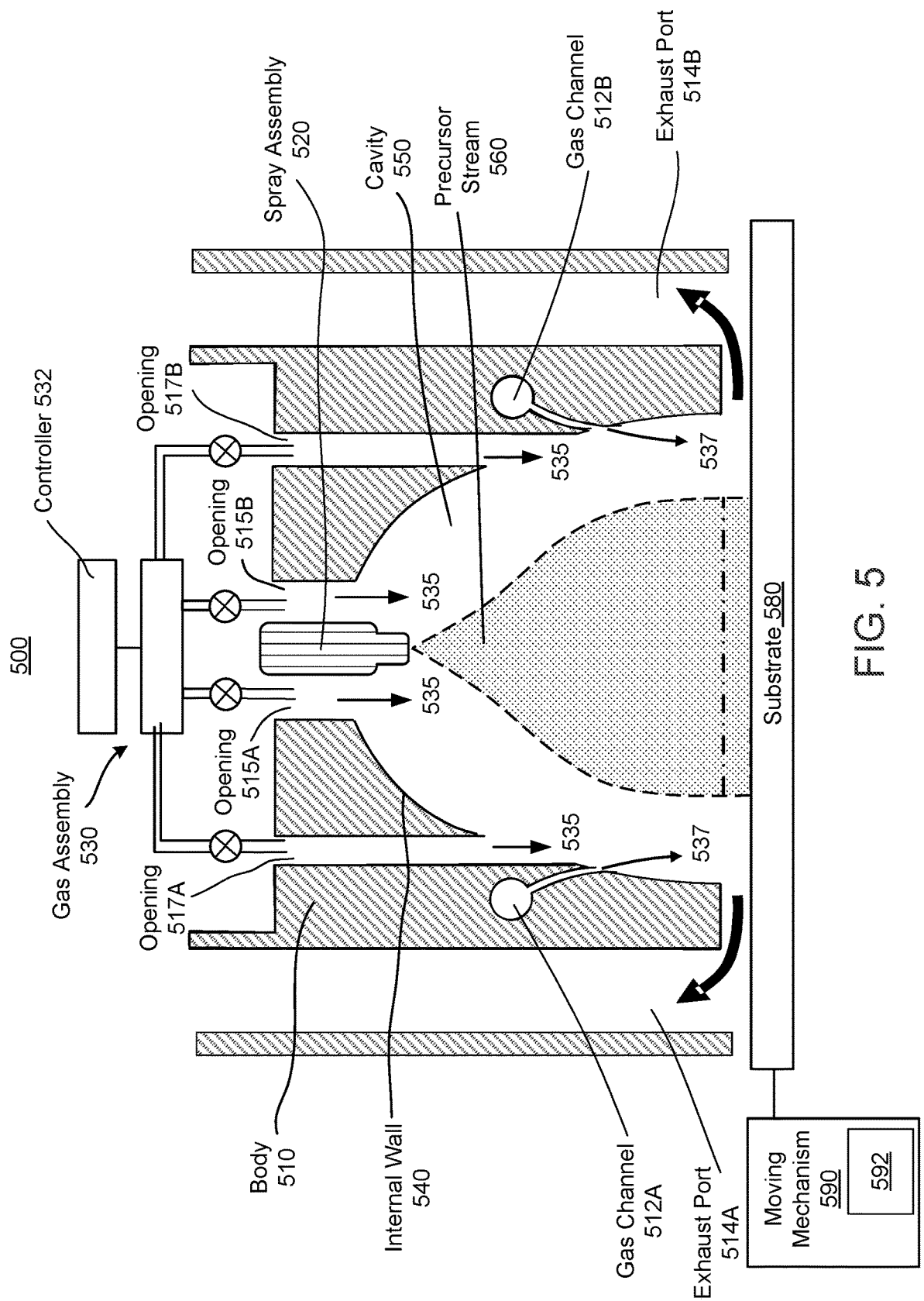
FIG. 5 is a schematic cross-sectional view of a film deposition apparatus including a body formed with gas channels and exhaust ports, in accordance with an embodiment.

FIG. 5 is a schematic cross-sectional view of a film deposition apparatus 500 including, among other components, a body 510 formed with gas channels 512 and exhaust ports 514 and a gas assembly 530, in accordance with an embodiment. In additional to the body 510, the film deposition apparatus 500 also includes a controller 532, a spray assembly 520 and a gas assembly 530.

The body 510 includes an internal wall 540 that forms a cavity 550. In addition to the gas channels 512 and exhaust ports 514, the body 510 is also formed with first openings 515 and second openings 517. The first openings 515 can be embodiments of the first openings 315 in FIG. 3. The first openings 517 can be embodiments of the first openings 317 in FIG. 3. The gas channels 512 are located further from the spray assembly 520 than the second openings 517.

The spray assembly 520 sprays a stream of precursor 560 into the cavity 550. The spray assembly 520 can be the spray assembly 320 in FIG. 3.

The gas assembly 530 injects a first gas into the first openings 515 and a second gas into the second openings 517. In FIG. 5, the first gas and second gas is the same gas 535. In other embodiments, they can be different gases. For example, they can have different composition or different injecting speed. The gas assembly 530 can be the gas assembly 330 in FIG. 3. The injected gas 535 forms an entraining gas with ambient gas (such as the ambient gas 337 shown in FIG. 3) that enters into the cavity 550 through the first openings 515 and second openings 517. The entraining gas shapes the precursor stream 560. The gas assembly 530 also injects a curtain gas 537 into the gas channels 512 for further shaping the precursor stream 560. The curtain gas 537 further narrows the precursor stream 560. In some embodiments, the curtain gas 537 can collimate the precursor stream 560 to make the precursor stream 560 parallel to a direction the spray assembly 520 sprays the precursor. With the combination of the entraining gas and curtain gas 537, the precursor stream 560 has a shape of a pencil or bullet. The directionality and utilization of the precursors stream 560 is further improved by the curtain gas 537.

The exhaust ports 514A, 514B (collectively referred to as "exhaust ports 514") allow discharge of by-product of the precursor from the body 510. This prevents undesirable absorption of the by-products on the substrate 580. The exhaust ports 514 can also facilitate discharging of other substances, such as entraining gas, curtain gas, unsolidified precursor, and so on.

A moving mechanism 590 including a motor 592 is attached onto the substrate 580 to cause motion of the substrate 580. For example, the moving mechanism 590 drives the substrate 580 to move along the film deposition apparatus 500 to allow film deposition on different locations of the substrate 580.

Figure 6:
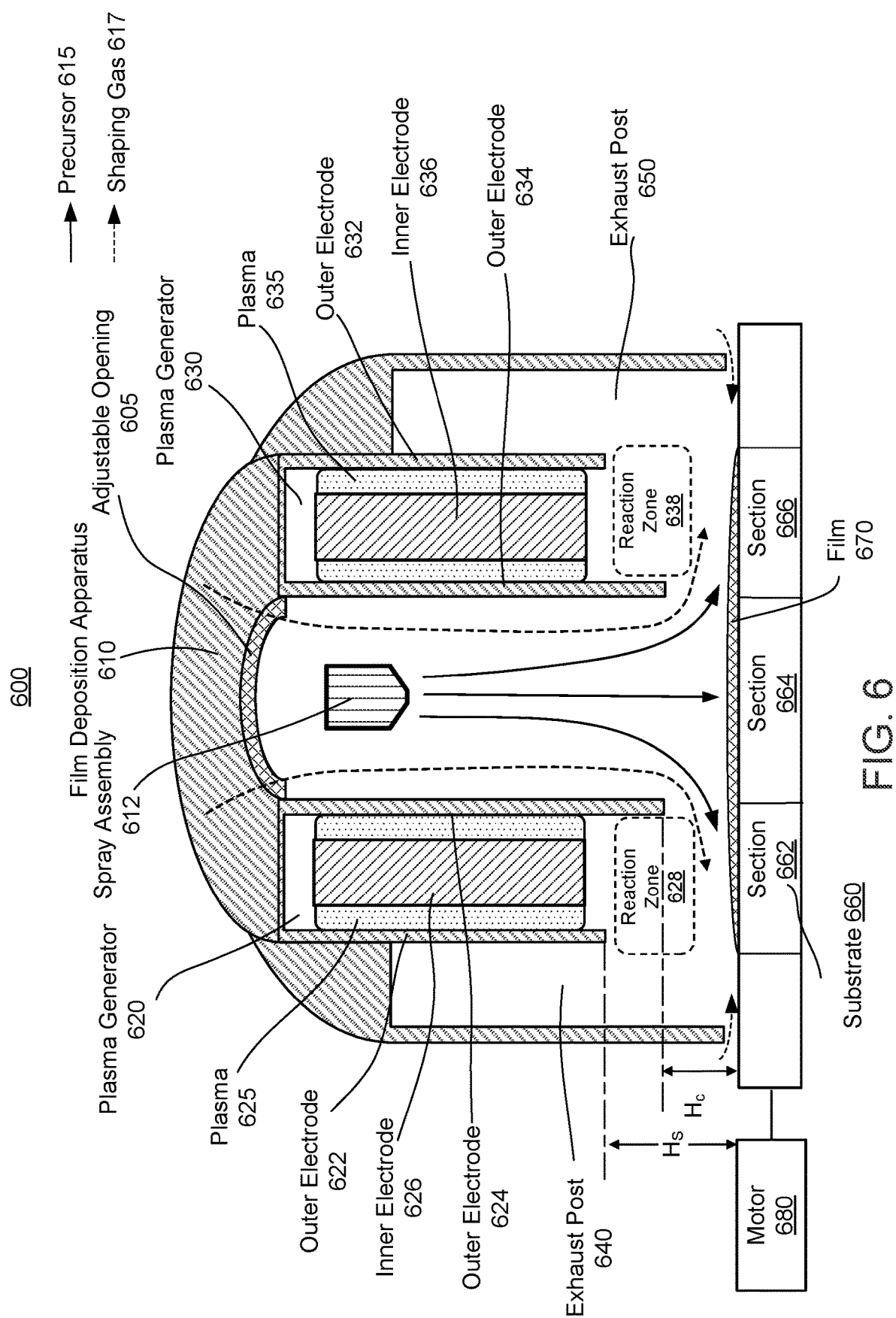
FIG. 6 is a schematic cross-sectional view of a plasma reactor, in which a film deposition apparatus operates with plasma generators, in accordance with an embodiment, in accordance with embodiments.

FIG. 6 is a schematic cross-sectional view of a plasma reactor 600, in which a film deposition apparatus 610 operates with plasma generators 620 and 630, in accordance with an embodiment. The plasma generator 620 is located between the cavity of the film deposition apparatus 610 and exhaust post 640. The plasma generator 630 is located between the cavity of the film deposition apparatus 610 and exhaust post 650. The plasma reactor 600 forms a film 670 on a substrate 660 using precursor 615 injected by a spray assembly 612. Formation of the film 670 can be at atmospheric pressure or a reduced pressure.

The film deposition apparatus 610 sprays a precursor 615 towards the substrate 660. An embodiment of the film deposition apparatus 610 is the film deposition apparatus 300 in FIG. 3 or the film deposition apparatus 500 in FIG. 5. For the purpose of illustration and simplicity, not all the components of the film deposition apparatus 610 are shown in FIG. 6. For example, the film deposition apparatus 610 can have a body similar to the body 310 in FIG. 3. The body can include an internal wall that defines a cavity into which the precursor 615 is sprayed. The body can also be formed with openings and gas channels. In some embodiments, the openings include one or more adjustable openings 605. The size of an adjustable opening 605 can be adjusted. In addition to the body, the film deposition apparatus 610 can have a gas injection assembly similar to the gas injection assembly 330 in FIG. 3. The gas injection assembly can inject a gas 617 into the cavity through the openings. The injected gas can be a combination of the gas 535 and curtain gas 537 in FIG. 5. The injected gas, with ambient gas that enters into the cavity through the openings, forms a shaping gas 617 for shaping the stream of the precursor 615. The amount and/or flow rate of the shaping gas 617 can be controlled by adjusting the size of an adjustable aperture 605. The precursor 615 flows in various directions. Representative flowing directions of the precursor 615 are indicated by the solid line arrows in FIG. 6. As shown in FIG. 6, a part of the precursor 615 reaches the substrate 660, a part flows into an area (reaction zone 628) between the plasma generator 620 and the substrate 660, and the remaining part flows into an area (reaction zone 638) between the plasma generator 630 and the substrate 660.

The plasma generator 620 generates a plasma 625. The plasma generator 620 includes a pair of outer electrodes 622 and 624 and an inner electrode 626. A gas can be injected into gaps between each of the outer electrodes 622 and 624 and inner electrode 626. Also, an electrical voltage is applied across each of the outer electrodes 622 and 624 and inner electrode 626 to ionize the gas and generate the plasma 625. The plasma generator 630 generates a plasma 635. The plasma generator 630 includes a pair of outer electrodes 632 and 634 and an inner electrode 636. Similar to the plasma 625, the plasma 635 is generated while an electrical voltage is applied across each of the outer electrodes 632 and 634 and the inner electrode 636 to ionize a gas between each of the outer electrodes 632 and 634 and the inner electrode 636. In some embodiments, the outer electrode 624 or 634 is part of the body of the film deposition apparatus 610. The plasma 625 or 635 can include $O_2$ plasma, $N_2O$ plasma, $O_3$ plasma, $NH_3$ plasma, $N_2$ plasma, $H_2$ plasma, or any combination thereof.

The exhaust ports 640 and 650 discharge remaining gas or liquid from the plasma reactor 600. Examples of the remaining gas or liquid includes unsolidified precursor, precursor by-product, residue plasma, shaping gas, etc.

The substrate 660 includes three sections 662, 664, and 666, which are located under the plasma generator 620, the film deposition apparatus 610, and the plasma generator 630, respectively. A motor 680 is associated with the substrate 660 so that the substrate 660 can move relative to the plasma reactor 600.

The film 670 is formed on the three sections 662, 664, and 666 of the substrate 660. The thickness of the film 670 can be adjusted by changing various parameters, including a distance from the bottom of the outer electrode 624 or 634 to the substrate 660 ($H_c$ in FIG. 6), a distance from the bottom of the outer electrode 622 or 632 to the substrate 660 ($H_c$ in FIG. 6), spraying speed of each precursor, distance between the plasma reactor 600 and the substrate 660, size of at least one of the openings, and moving speed of the substrate 660. Formation rate of the film 670 can be adjusted by changing shape of precursor streams, sizes of the openings for injecting the shaping gases 617, positions of the spray assembly, or any combination thereof. In some embodiments, a precursor can be mixed with a gas, such as the shaping gas 617, for controlling film formation rate or deposition rate. Each layer of the laminated film can have a thickness in a range from one nanometer to hundreds of micrometers.

The surface area of the film 670 can be adjusted by changing $H_c$ and $H_s$. $H_c$ and $H_s$ determines dimensions of the sprayed precursor stream. For the plasma reactor 600 in FIG. 6, $H_c$ is smaller than $H_s$. The plasma reactor 600 can be used for near-field spray film formation. A plasma reactor having $H_c$ larger than $H_s$ can be used for far-field spray film formation. Compared with a plasma reactor for far-field spray film formation, the plasma reactor 600 sprays narrower precursor streams.

When the substrate 660 remains still, different materials can be deposited onto the three sections 662, 664, and 666. For example, the part of the precursor 615 that reaches the substrate 660 is absorbed and solidified on the section 664. In some embodiments, the plasma 625 and/or 635 can be used to solidify the precursor on the section 664 or treat the solidified film on the section 664, for example, by slightly moving the substrate in relative to the plasma reactor 600 to expose the section 664 to the plasma 625 or 635.

The part of the precursor 615 that reaches the reaction zone 628 is exposed to the plasma 625, and can react with active species (such as radicals, reactant gas, etc.) in the plasma 625 before it is deposited onto the section 662. Similarly, the part of the precursor 615 that reaches the reaction zone 638 is exposed to the plasma 635 and can react with active species in the plasma 635 before it is deposited onto the section 666. The film deposition process for the sections 662 and 666 can be similar to a plasma-enhanced chemical vapor deposition process. The material deposited onto the section 662 can be different from that deposited onto the section 666 for reasons such as different types of reactions occurring in the reaction zones 628 and 638, different active species in the plasma 625 and plasma 635, etc.

When the substrate 660 moves in relative to the plasma reactor 600, a laminated film can be formed on the substrate 660. FIGS. 7A through 7D illustrate formation of a laminated film by the plasma reactor 600 in FIG. 6, in accordance with an embodiment. The laminated film 700 is formed on the section 662 of the substrate 660. In the embodiment of FIGS. 7A through 7D, the substrate 660 moves in a direction from the plasma generator 620 towards the plasma generator 630.

Figure 7A:
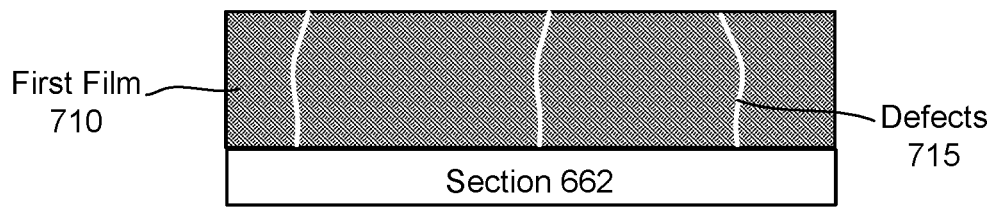
FIGS. 7A through 7D illustrate formation of a laminated film by the plasma reactor in FIG. 6, in accordance with an embodiment.

In FIG. 7A, the section 662 is initially located under the plasma generator 620, as illustrated in FIG. 6. The film deposition apparatus 610 sprays a first precursor (e.g., the precursor 615), a part of which flows into the reaction zone 628 below the plasma generator 620. In the reaction zone 628, the first precursor reacts with active species in the plasma 625 generated by the plasma generator 620 and then is deposited onto the section 662 to form a first film 710 on the section 662. In embodiments where the first precursor is in vapor phase, the process of forming the first film 710 is similar to chemical vapor deposition (CVD). In embodiments where the first precursor is in liquid state or includes solid participles with liquid, the first film 710 is formed through a plasma solidification process, such as cross-linking, polymerization, or structural solid transformation. The first film 710 may have defects 715, such as voids or porosities.

Figure 7B:
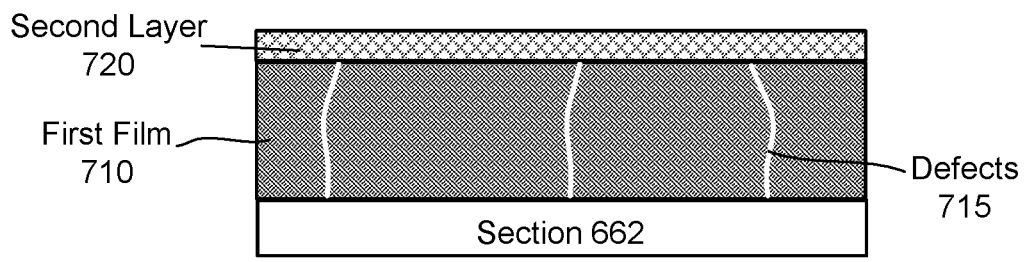

In FIG. 7B, the first film 710 has been formed and the substrate 660 is moved relative to the plasma reactor 600 so that the section 662 is under the film deposition apparatus 610. The film deposition apparatus 610 sprays a second precursor. The second precursor can be in liquid phase or solid phase. In some embodiments, the second precursor is a mixture of nano-sized solid particles and a liquid-phase precursor. The second precursor reaches the first film 710 and molecules of the second precursor are adsorbed onto the first film 710, forming a second layer 720. The second layer is a cluster molecular layer. It can be a liquid layer or include solid particles in liquid phase.

Figure 7C:
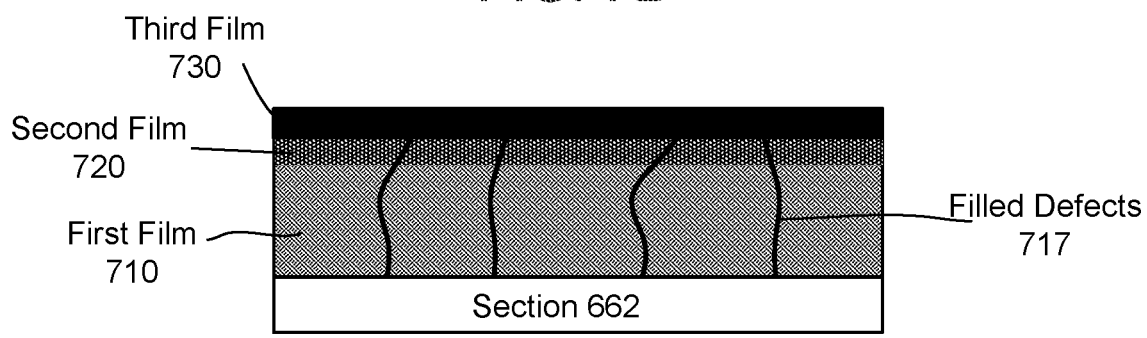

In FIG. 7C, the substrate 660 is further moved so that the section 662 is under the plasma generator 630. The plasma generator 630 generates the plasma 635 which flows onto the second layer 720. With the plasma 635, a second film 725 is formed through a plasma reaction of a top section of the first film 710 with molecules of the second precursor that diffuse into the first film 710. The second film 725 is a composite of the first precursor and the second precursor. In some embodiments, the second film 725 is formed through infiltration process, impregnation process, and/or plasma-enhanced cross-linking process. Also, molecules of the second precursor can infiltrate into the first film 710 and fill the defects 715. A depth of the infiltration can be controlled by one or more parameters, such as dimension of the area exposed to the second precursor, moving speed of the substrate 660, etc. With the defects 715 being filled, mechanical and/or electrical properties of the first film 720 are improved.

A third film 730 is also formed in FIG. 7C through solidification of the second layer 720, or at least part of the second layer 720, on top of the second film 725, which is referred to as a comprehensive solid transformation (CST) process. The CST process may include a vapor-to-liquid, liquid-to-solid, or solid-to-solid phase transformation. The phase transformation can be through a reaction between the second layer 720 and the plasma 635. In some embodiments, the third film 730 is a monolayer of atoms or molecules of the second precursor.

The CST process share advantages of atomic layer deposition (ALD). For example, the CST process is a process of non-overlapping pulses of the source precursor. The CST process can produce films of high conformality and inherent quality. Also, it can be repeated sequentially to obtain thicker films. The CST process also have advantageous over ALD including, but not limited to, the following. First, purge is not required in the CST process. Second, the source precursor of the CST process can be in gas phase, liquid phase, and solid phase, versus ALD only applies to gas precursors. Third, the CST process is more efficient. The CST process can form films with thickness in the nanometer range or even higher, versus ALD forms mono-atom layer films, which is about one angstrom. In order to make a film having a thickness in the nanometer range or higher, the ALD process has to be repeated many times. Fourth, the CST process has no limitations on the substrate. ALD requires reactions between precursors and the surface of the substrate. In contrast, the CST process is through reaction of the source precursor with plasma. Fourth, the CST process facilitates production of sandwich-structured film, such as the laminated film formed in FIGS. 7A through 7D, versus ALD only enables accumulation of mono-atom layers, which is more time-consuming.

Figure 7D:
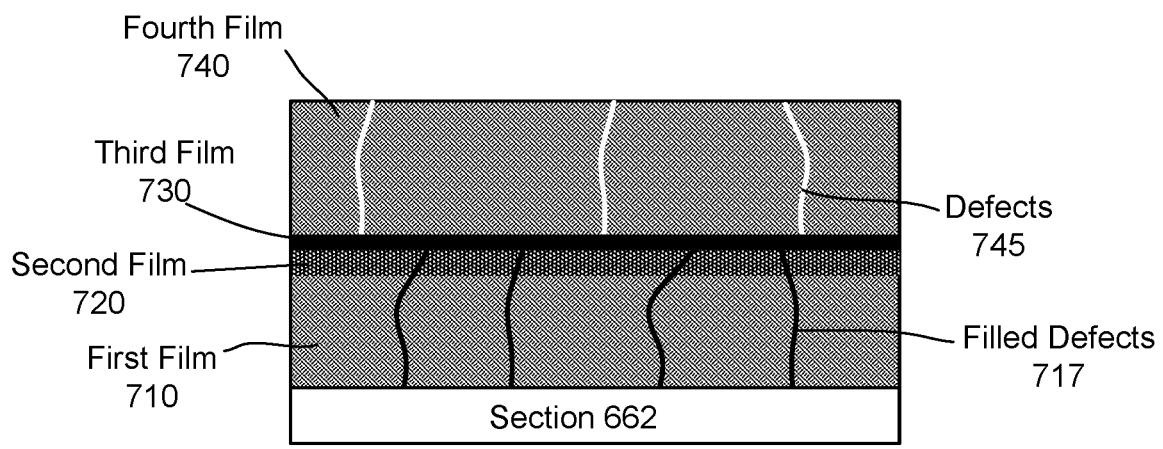

In FIG. 7D, the third film 730 has been formed. The film deposition apparatus 610 sprays a third precursor, a part of which migrates to the reaction zone 638 and reacts with the plasma 635 to form a new material. This new material is deposited onto the third film 730, forming a fourth film 740. Similar to the process in FIG. 7A, in embodiments where the third precursor is in vapor phase, the fourth film 740 is formed through CVD. In embodiments where the third precursor is in liquid state or includes solid participles with liquid, the fourth film 710 is formed through a plasma solidification process, such as cross-linking, polymerization, or structural solid transformation. Similar to the initially formed first film 710, the fourth film 740 also have defects 745. The defects 745 can be filled by repeating the process in FIGS. 7B and 7C.

With the process described in FIGS. 7A through 7D, the plasma reactor 600 forms a defect-free laminated film on the substrate. Composition of each layer of the laminated film can be controlled by composition of the first precursor, second precursor, third precursor, the plasma 625, the plasma 635, the shaping gas 617, or any combination thereof. The first, second, and third precursor may have the same composition.

Figure 8A:
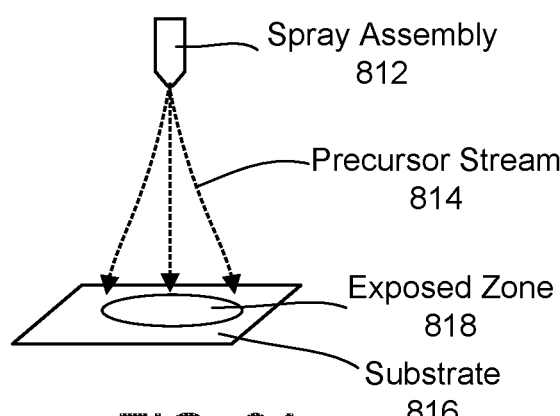
FIGS. 8A and 8B illustrate precursor streams sprayed by a plasma reactor for near-field spray film formation, in accordance with an embodiment.
Figure 8B:
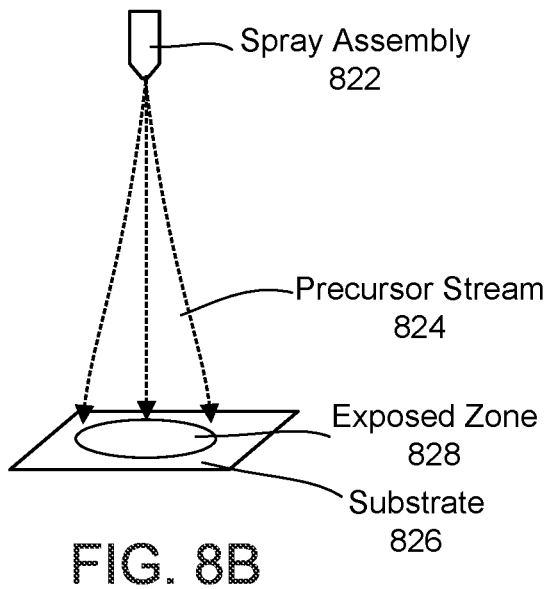
Figure 8C:
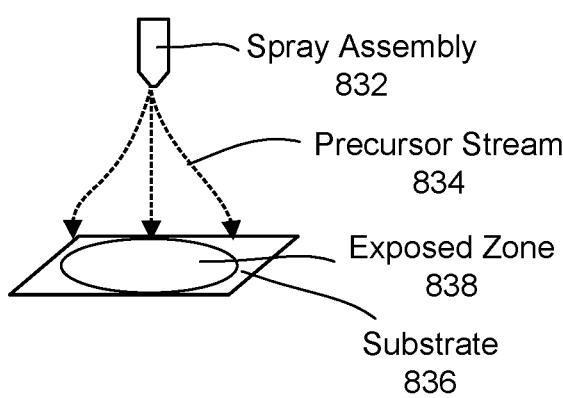
FIGS. 8C and 8D illustrate precursor streams sprayed by a plasma reactor for far-field spray film formation, in accordance with an embodiment.
Figure 8D:
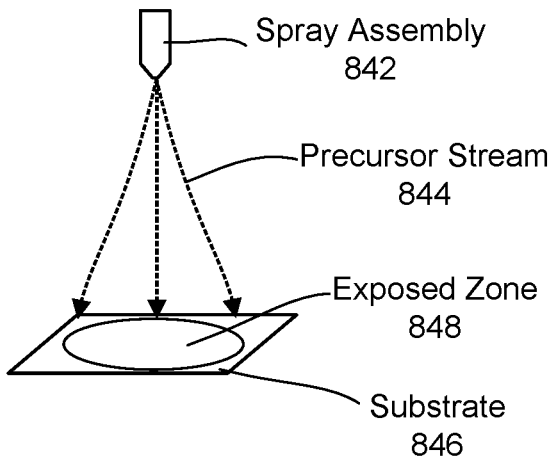

FIGS. 8A and 8B illustrate precursor streams 814 and 824 sprayed by a plasma reactor for near-field spray film formation, in accordance with an embodiment. FIGS. 8C and 8D illustrate precursor streams 834 and 844 sprayed by a plasma reactor for far-field spray film formation, in accordance with an embodiment. In FIG. 8A, the spray assembly 812 is closer to the substrate 816 than FIG. 8B. The precursor stream 814 therefore is shorter than the precursor stream 824. Similarly, the precursor stream 834 in FIG. 8C is short than the precursor stream 844 in FIG. 8D. Despite the length of the precursor streams, the exposed zones 816 and 826 in FIGS. 8A and 8B are smaller than the exposed zones 836 and 846 in FIGS. 8C and 8D. Therefore, a laminated film formed by a plasma reactor for near-field spray film formation has a smaller surface area than a laminated film formed by a plasma reactor for far-field spray film formation. That is because in a plasma reactor for near-field spray film formation (such as the plasma reactor 600 in FIG. 6), less precursor can migrate into the reaction zones 628 and 638 due to a smaller gap between the outer electrodes 624 and 634 and the substrate 660. Due to the less amount of precursor and the narrower precursor stream, the film formed from reaction of the precursor and the plasma (such as the first film 710 in FIG. 7A) is thinner and has less defects. Also, these defects are easier to be filled because of their smaller depth. Thus, a plasma reactor for near-field spray film formation can produce a more uniform film. In contrast, for a plasma reactor for far-field spray film formation, hight $H_c$ is higher, meaning the gap through which the precursor migrates into the reaction zone is larger. As a result, the formed film is thicker and has more and deeper defects. However, a plasma reactor for far-field spray film formation can confine the plasma better because height $H_s$ is lower.

Figure 9:
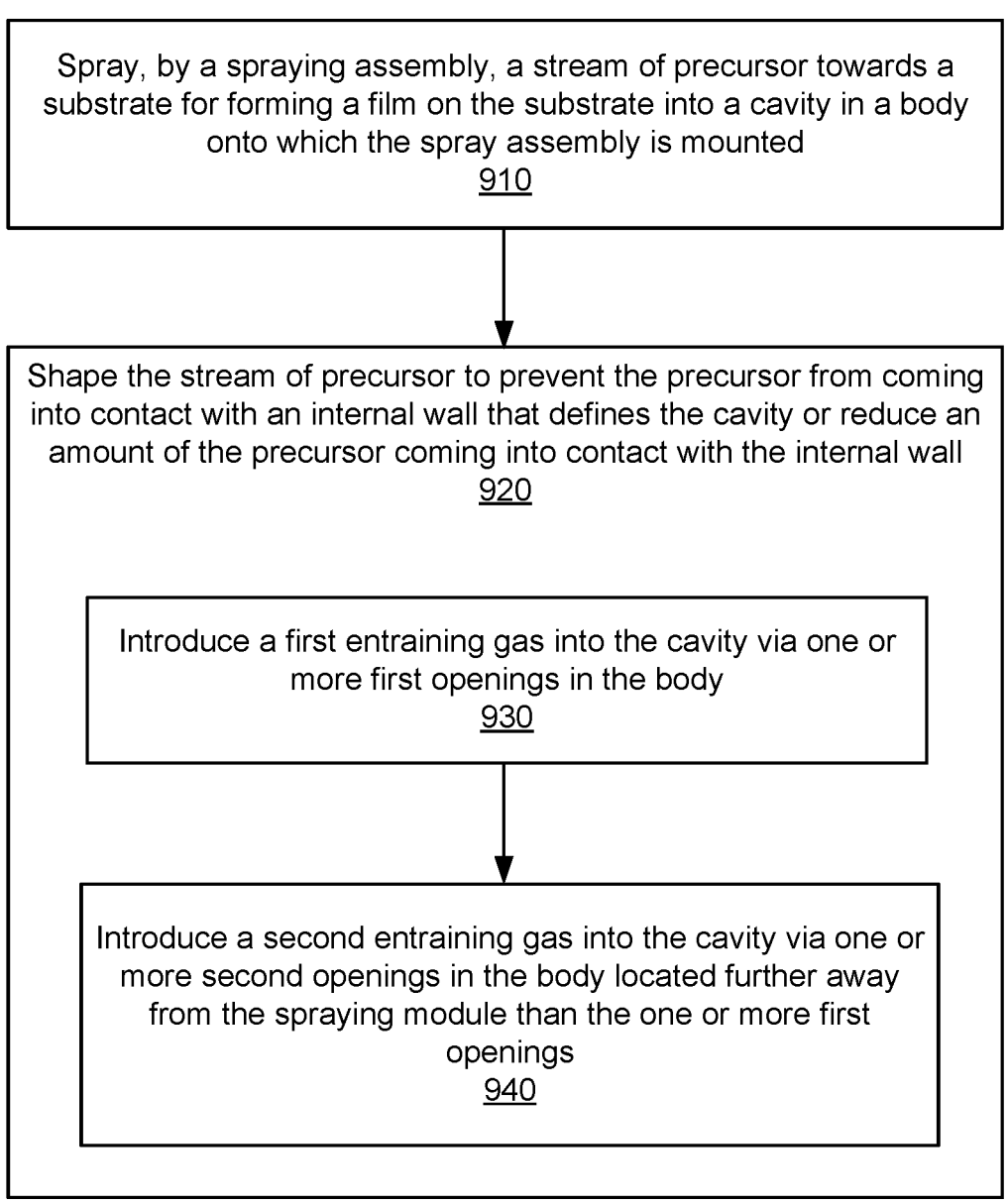
FIG. 9 is a flow chart illustrating a process for depositing a film onto a substrate, in accordance with an embodiment.

FIG. 9 is a flow chart illustrating a process for depositing a film onto a substrate, in accordance with an embodiment. The process can be performed by the film deposition apparatus 300 in FIG. 3. The process may include different or additional steps than those described in conjunction with FIG. 9 in some embodiments or perform steps in different orders than the order described in conjunction with FIG. 9.

A stream of precursor is sprayed 910 towards a substrate by a spraying assembly for forming a film on the substrate. The spray assembly is mounted onto a body. The body is formed with a cavity. The stream of precursor is sprayed into the cavity in the body. The precursor can be organic particles or inorganic particles.

The stream of precursor is shaped 920 to prevent the precursor from coming into contact with an internal wall that defines the cavity or reduce an amount of the precursor coming into contact with the internal wall. The stream of precursor can be shaped by introducing 930 a first entraining gas into the cavity via one or more first openings in the body and introducing 940 a second entraining gas into the cavity via one or more second openings in the body. The one or more second openings are located further away from the spraying assembly than the one or more first openings. The first and second entraining gas can include nitrogen, inert gas, ambient gas (such as the ambient gas 237 described in conjunction with FIG. 2 or the ambient gas 337 described in conjunction with FIG. 3), or mixtures thereof.

In some embodiments, the body is formed with one or more exhaust ports. Remaining precursor can be discharged from the cavity via the one or more exhaust ports. In some embodiments, a plasma is generated by a plasma generator and used for depositing the film or treating the deposited film. The plasma generator can be located between the cavity and the one or more exhaust ports.

Figure 10:
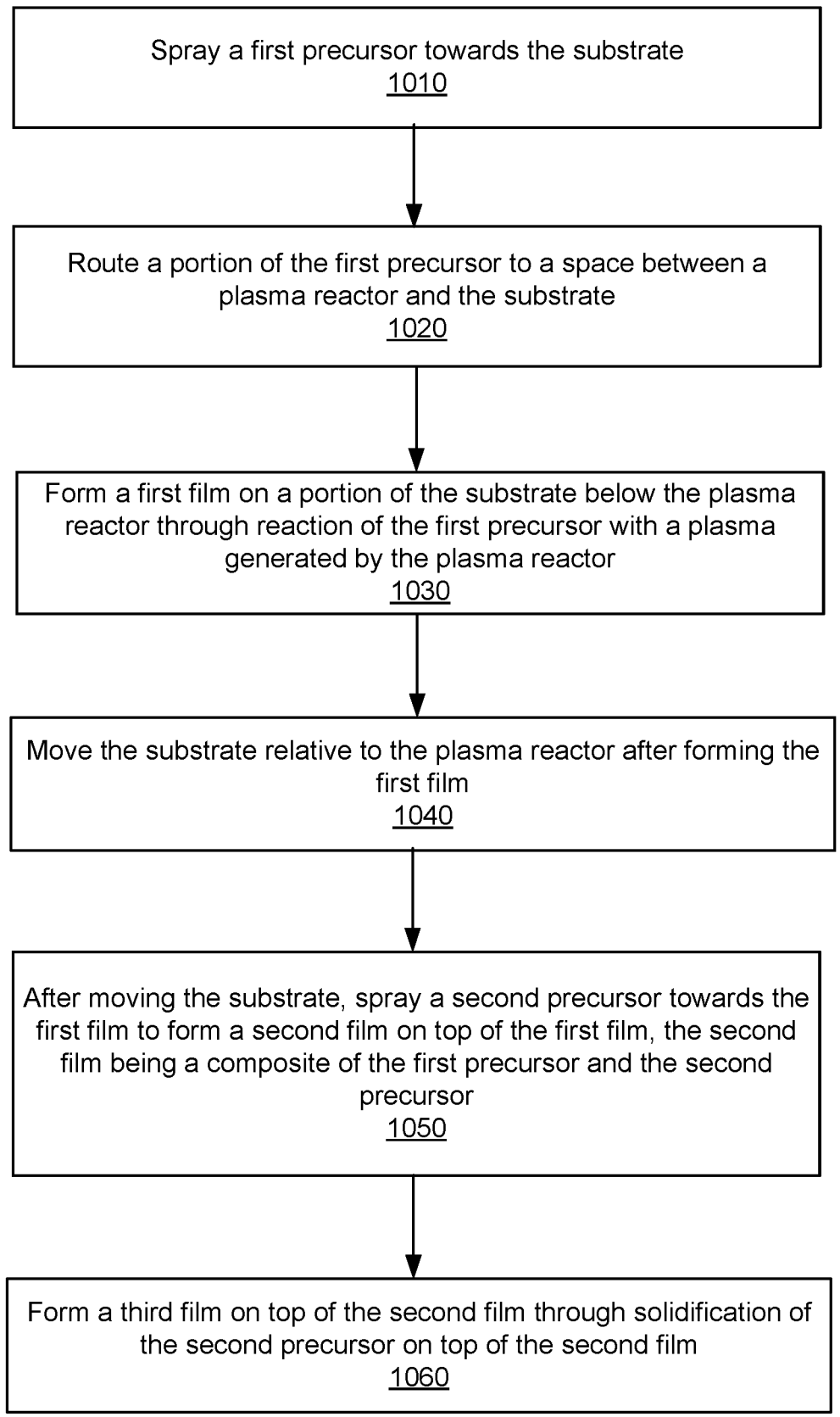
FIG. 10 is a flow chart illustrating a process for forming a laminated film on a substrate, in accordance with an embodiment.

FIG. 10 is a flow chart illustrating a process for forming a laminated film onto a substrate, in accordance with an embodiment. The process can be performed by the plasma reactor 600 in FIG. 6. The process may include different or additional steps than those described in conjunction with FIG. 10 in some embodiments or perform steps in different orders than the order described in conjunction with FIG. 10.

A first precursor is sprayed 1010 towards the substrate. A portion of the first precursor is routed 1020 to a space between a plasma reactor and the substrate. A first film is formed 1030 on a portion of the substrate below the plasma reactor through reaction of the first precursor with a plasma generated by the plasma reactor. The first precursor may also react with other substances existing in the space between the plasma reactor and the substrate. The substrate is moved 1040 relative to the plasma reactor after forming the first film.

After moving the substrate, a second precursor is sprayed 1050 towards the first film to form a second film on top of the first film. The second film is a composite of the first precursor and the second precursor. The second film can be formed by various processes, including infiltration of the second precursor into the first film, impregnation of the second precursor into the first film, or a cross-linking process between the second precursor and the first film. The second precursor can also infiltrate into micro-defects of the first film and fill these micro-defects to improve uniformity of the first film. In some embodiments, a stream of the second precursor is shaped to prevent the second precursor from coming into contact with an internal wall that defines a cavity in a body of the plasma reactor or reduce an amount of the second precursor coming into contact with the internal wall. The stream of the second precursor can be shaped by injecting an entraining gas toward the substrate via one or more openings in the body of the plasma reactor.

A third film can be formed 1060 on top of the second film through solidification of the second precursor on top of the second film. In some embodiments, the solidification of the second precursor on top of the second film is through a plasma generated by the plasma reactor. The plasma may also be used to treat the third film after it is formed.

In some embodiments, after forming the third film, the substrate is further moved relative to the plasma reactor. After the substrate is further moved, a third precursor is sprayed into the plasma reactor towards the substrate and a fourth film is deposited on top of the third film after a chemical reaction of the third precursor with active species in another plasma generated by the plasma reactor.

Remaining of the first, second, or third precursor can be discharged from the plasma reactor via one or more exhaust ports formed in the plasma reactor. A thickness of the laminated film can be adjusted by adjusting at least one of the following parameters: height of a bottom of a first outer electrode of the plasma reactor from the substrate, height of a bottom of a second outer electrode of the plasma reactor from the substrate, spraying speed of the first precursor, spraying speed of the second precursor, distance between the plasma reactor and the substrate, size of at least one of the openings, and moving speed of the substrate.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method for depositing a film, comprising: spraying, by a spraying assembly, a stream of precursor into a cavity defined by a wall towards a substrate for forming a film on the substrate; and shaping the stream of precursor to prevent the precursor from coming into contact with sides of the wall or reduce an amount of the precursor coming into contact with the sides of the wall by: introducing a first entraining gas into the cavity via a first opening, the first opening extending towards the substrate and enclosing at least a part of the spraying assembly, and introducing a second entraining gas into the cavity via a second opening located further away from the spraying assembly than the first opening, the second opening extending towards the substrate and enclosing at least a portion of the spraying assembly; and discharging remaining precursor from the cavity through an exhaust port formed at the wall, further shaping the stream of precursor by injecting a curtain gas towards the substrate via a gas channel contained within the wall and located outward from the spraying assembly than the second opening.

2. The method of claim 1, wherein the further shaped stream of precursor has a shape of a pencil or bullet.

3. The method of claim 1, wherein the first entraining gas has a different flow rate from the second entraining gas.

4. The method of claim 1, wherein the first entraining gas has a different material from the second entraining gas.

5. The method of claim 1, further comprising:
adjusting a size of the first opening to change an amount of the first entraining gas.

6. The method of claim 1, further comprising:
adjusting a size of the second opening to change an amount of the second entraining gas.

7. The method of claim 1, further comprising:
generating plasma by a plasma generator located between the cavity and the exhaust port; and
using the plasma for forming the film or treating the film.

8. The method of claim 7, wherein a part of the precursor is exposed to the plasma before the part of the precursor contacts the substrate.

9. The method of claim 7, wherein the plasma generator comprises a first outer electrode and a second outer electrode, the first outer electrode is closer to the cavity than the second outer electrode.

10. The method of claim 9, wherein a height of a bottom of the first outer electrode from the substrate is lower than a height of a bottom of the second inner electrode from the substrate.

11. The method of claim 7, wherein the plasma includes at least one of $O_2$ plasma, $N_2O$ plasma, $O_3$ plasma, $NH_3$ plasma, $N_2$ plasma, and $H_2$ plasma.

12. The method of claim 1, further comprising:
instructing a motor to cause relative motion between the substrate and the wall.

13. The method of claim 12, wherein instructing the motor to cause relative motion between the substrate and the wall comprises:
instructing the motor to cause relative motion between the substrate and the wall in a reciprocating matter to a plurality of layers of the film on the substrate.

14. The method of claim 1, wherein the cavity has a circular cross-section.

15. The method of claim 14, wherein the first opening or the second opening has a ring-shaped cross-section.

16. The method of claim 1, wherein the cavity has a circular cross-section.

17. The method of claim 16, wherein the first opening or the second opening has a rectangular-shaped cross-section.

18. The method of claim 16, wherein the first opening or the second opening has a cross-section having a race-track shape.

19. The method of claim 1, further comprising:
forming the film at atmospheric pressure.

* * * * *